United States Patent
Lee et al.

(10) Patent No.: US 6,954,164 B2
(45) Date of Patent: Oct. 11, 2005

(54) DIGITAL TO ANALOG CONVERTER TRANSISTOR ARRAY AND METHOD OF LAYOUT

(75) Inventors: Kwang-Hee Lee, Suwon (KR); Kyeong-Tae Moon, Gyeonggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 104 days.

(21) Appl. No.: 10/680,478

(22) Filed: Oct. 7, 2003

(65) Prior Publication Data

US 2004/0075116 A1 Apr. 22, 2004

(30) Foreign Application Priority Data

Oct. 22, 2002 (KR) .................................. 10-2002-0064643

(51) Int. Cl.⁷ ...................... H03M 1/66; H01L 29/739; H01L 27/10
(52) U.S. Cl. ...................................... 341/144; 257/202
(58) Field of Search ................................. 341/144, 145, 341/153, 154, 136; 257/202; 438/128

(56) References Cited

U.S. PATENT DOCUMENTS

| | | | | | |
|---|---|---|---|---|---|
| 5,001,484 A | * | 3/1991 | Weiss | ........................ | 341/153 |
| 5,568,145 A | * | 10/1996 | Reynolds | .................... | 341/145 |
| 5,627,538 A | * | 5/1997 | Ferry | ........................ | 341/144 |
| 6,166,670 A | * | 12/2000 | O'Shaughnessy | .......... | 341/136 |
| 6,222,474 B1 | * | 4/2001 | Fattaruso et al. | .......... | 341/154 |
| 6,225,933 B1 | * | 5/2001 | Salter et al. | ................ | 341/144 |
| 6,317,066 B1 | * | 11/2001 | Chiang | ...................... | 341/144 |
| 6,317,069 B1 | * | 11/2001 | Male et al. | ................. | 341/154 |
| 6,469,646 B1 | * | 10/2002 | Song | ........................ | 341/144 |
| 6,720,898 B1 | * | 4/2004 | Ostrem | ..................... | 341/144 |

* cited by examiner

Primary Examiner—Patrick Wamsley
(74) Attorney, Agent, or Firm—F.Chau & Associates, LLC (57) ABSTRACT

The present invention discloses a transistor array and a layout method, the array including a plurality of first LSB transistors arranged along diagonal directions of a central portion of a first quadrant of an array including a plurality of rows and a plurality of columns; a plurality of first MSB transistors arranged along diagonal directions above and below the plurality of first LSB transistors, respectively; a plurality of second LSB transistors and a plurality of second MSB transistors arranged on a second quadrant of the array to be symmetrical in a Y-axis direction to the plurality of first LSB transistors and the plurality of first MSB transistors; a plurality of third LSB transistors and a plurality of third MSB transistors arranged on a third quadrant of the array to be symmetrical in an X-axis direction to the plurality of first LSB transistors and the plurality of first MSB transistors; and a plurality of fourth LSB transistors and a plurality of fourth MSB transistors arranged on a fourth quadrant of the array to be symmetrical in a Y-axis direction to the plurality of third LSB transistors and the plurality of third MSB transistors, such that the transitor array can minimize the effects of temperature distribution and process variation.

20 Claims, 8 Drawing Sheets

PRIOR ART

|   | M15 | M14 | M13 | M12 | M11 | M10 | M9 | M8 | M7 | M6 | M5 | M4 | M3 | M2 | M1 | L1~L15 |
|---|---|---|---|---|---|---|---|---|---|---|---|---|---|---|---|---|
| | T1,1 | T1,2 | T1,3 | T1,4 | T1,5 | T1,6 | T1,7 | T1,8 | T1,9 | T1,10 | T1,11 | T1,12 | T1,13 | T1,14 | T1,15 | T1,16 | M15 |
| | T2,1 | T2,2 | T2,3 | T2,4 | T2,5 | T2,6 | T2,7 | T2,8 | T2,9 | T2,10 | T2,11 | T2,12 | T2,13 | T2,14 | T2,15 | T2,16 | M14 |
| | T3,1 | T3,2 | T3,3 | T3,4 | T3,5 | T3,6 | T3,7 | T3,8 | T3,9 | T3,10 | T3,11 | T3,12 | T3,13 | T3,14 | T3,15 | T3,16 | M13 |
| | T4,1 | T4,2 | T4,3 | T4,4 | T4,5 | T4,6 | T4,7 | T4,8 | T4,9 | T4,10 | T4,11 | T4,12 | T4,13 | T4,14 | T3,15 | T4,16 | M12 |
| | T5,1 | T5,2 | T5,3 | T5,4 | T5,5 | T5,6 | T5,7 | T5,8 | T5,9 | T5,10 | T5,11 | T5,12 | T5,13 | T5,14 | T5,15 | T5,16 | M11 |
| | T6,1 | T6,2 | T6,3 | T6,4 | T6,5 | T6,6 | T6,7 | T6,8 | T6,9 | T6,10 | T6,11 | T6,12 | T6,13 | T6,14 | T6,15 | T6,16 | M10 |
| | T7,1 | T7,2 | T7,3 | T7,4 | T7,5 | T7,6 | T7,7 | T7,8 | T7,9 | T7,10 | T7,11 | T7,12 | T7,13 | T7,14 | T7,15 | T7,16 | M9 |
| | T8,1 | T8,2 | T8,3 | T8,4 | T8,5 | T8,6 | T8,7 | T8,8 | T8,9 | T8,10 | T8,11 | T8,12 | T8,13 | T8,14 | T8,15 | T8,16 | M8 |
| | T9,1 | T9,2 | T9,3 | T9,4 | T9,5 | T9,6 | T9,7 | T9,8 | T9,9 | T9,10 | T9,11 | T9,12 | T9,13 | T9,14 | T9,15 | T9,16 | M7 |
| | T10,1 | T10,2 | T10,3 | T10,4 | T10,5 | T10,6 | T10,7 | T10,8 | T10,9 | T10,10 | T10,11 | T10,12 | T10,13 | T10,14 | T10,15 | T10,16 | M6 |
| | T11,1 | T11,2 | T11,3 | T11,4 | T11,5 | T11,6 | T11,7 | T11,8 | T11,9 | T11,10 | T11,11 | T11,12 | T11,13 | T11,14 | T11,15 | T11,16 | M5 |
| | T12,1 | T12,2 | T12,3 | T12,4 | T12,5 | T12,6 | T12,7 | T12,8 | T12,9 | T12,10 | T12,11 | T12,12 | T12,13 | T12,14 | T12,15 | T12,16 | M4 |
| | T13,1 | T13,2 | T13,3 | T13,4 | T13,5 | T13,6 | T13,7 | T13,8 | T13,9 | T13,10 | T13,11 | T13,12 | T13,13 | T13,14 | T13,15 | T13,16 | M3 |
| | T14,1 | T14,2 | T14,3 | T14,4 | T14,5 | T14,6 | T14,7 | T14,8 | T14,9 | T14,10 | T14,11 | T14,12 | T14,13 | T14,14 | T14,15 | T14,16 | M2 |
| | T15,1 | T15,2 | T15,3 | T15,4 | T15,5 | T15,6 | T15,7 | T15,8 | T15,9 | T15,10 | T15,11 | T15,12 | T15,13 | T15,14 | T15,15 | T15,16 | M1 |
| | T16,1 | T16,2 | T16,3 | T16,4 | T16,5 | T16,6 | T16,7 | T16,8 | T16,9 | T16,10 | T16,11 | T16,12 | T16,13 | T16,14 | T16,15 | T16,16 | |

FIG. 8

DIGITAL TO ANALOG CONVERTER TRANSISTOR ARRAY AND METHOD OF LAYOUT

BACKGROUND OF THE INVENTION

1. Field of the Invention

The present invention relates to transistor arrays, and more particularly, to transistor arrays arranged in consideration of error value on a single chip.

2. Description of Related Art

A layout method for a conventional transistor array is explained below with reference to an examplary transistor array of a flash type digital to analog ("D/A") converting circuit that receives an 8-bit digital signal and converts it to generate an analog signal having 256 various levels.

Figure 1:
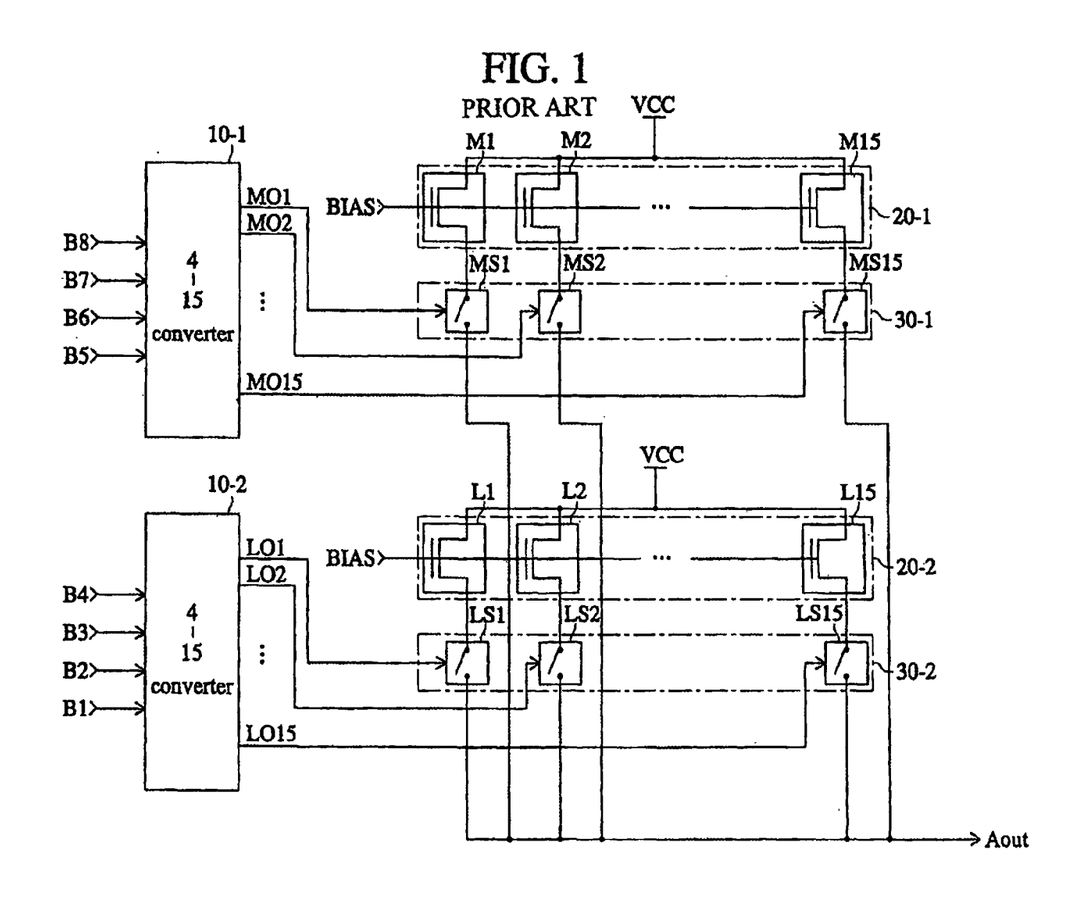
FIG. 1 is a configuration of a conventional digital to analog converting circuit.

FIG. 1 shows a configuration of a conventional digital to analog converting circuit. The D/A converting circuit of FIG. 1 includes four-to-fifteen type converters 10-1 and 10-2, an MSB transistor array 20-1, an LSB transistor array 20-2, MSB switches 30-1, and LSB switches 30-2.

As shown in FIG. 1, the MSB transistor array 20-1 includes transistors M1 to M15, and the LSB transistor array 20-2 includes transistors L1 to L15. The size of each of the transistors M1 to M15 of the MSB transistor array 20-1 is 16 times as large as that of each of the transistors L1 to L15 of the LSB transistor array 20-2. That is, 16 LSB-sized transistors constitute a single MSB transistor. Each of the transistors M1 to M15 and L1 to L15 includes an NMOS transistor having a drain to which a power voltage VCC is applied, and a gate to which a bias voltage is applied. The MSB switches 30-1 include switches MS1 to MS15 connected between the respective transistors M1 to M15 and a terminal for generating an output signal Aout, and the LSB switches 30-2 include switches LS1 to LS15 connected between the respective transistors L1 to L15 and the terminal for generating the output signal Aout.

Operation of the components of the D/A converting circuit of FIG. 1 is explained below.

The four-to-fifteen type converter 10-1 converts an upper 4-bits B8 to B5 of an 8-bit digital signal B8 to B1 to generate a 15-bit digital signal MO1 to MO15. When the upper 4-bits B8 to B5 are "0000", the digital signal MO1 to MO15 of "00 . . . 0" is generated. And, when the upper 4-bits B8 to B5 are "0001", the digital signal MO1 to MO15 of "00 . . . 1" is generated. Also, when the digital signal B8 to B5 is "0011", the digital signal MO1 to MO15 of "00 . . . 011" is generated. That is, whenever the digital signal B8 to B5 is increased by 1, a bit number of "1" of the digital signal MO1 to MO15 is increased by 1. The four-to-fifteen type converter 10-2 converts a lower 4-bits B4 to B1 of an 8-bit digital signal B8 to B1 to generate a 15-bit digital signal LO1 to LO15. The transistors M1 to M15 allow a constant amount of electric current to flow, and the transistors L1 to L15 also allow a constant amount of electric current to flow. Here, since a size of each of the transistors M1 to M15 is 16 times as large as that of each of the transistors L1 to L15, an amount of electric current flowing along each of the transistors M1 to M15 is 16 times as much as that flowing along each of the transistors L1 to L15. The MSB switches MS1 to MS15 are each turned on when each of the digital signals MO1 to MO15, respectively, have a high level, allowing an electric current to flow to the terminal for generating the output signal Aout. The LSB switches LS1 to LS15 are each turned on when each of the digital signals LO1 to LO15, respectively, have a high level, allowing an electric current to flow to the terminal for generating the output signal Aout. An electric current through the MSB switches 30-1 and an electric current through the LSB switches 30-2 join and flow to the terminal for generating the output signal Aout. A current outputted through the terminal for generating the output signal Aout has a total of 256 levels. At this time, a difference between current levels should be uniform.

However, in the conventional layout method of the MSB and LSB transistor array, analog signals outputted from the output signal (Aout) generating terminal do not have a uniform level difference.

Figure 2:
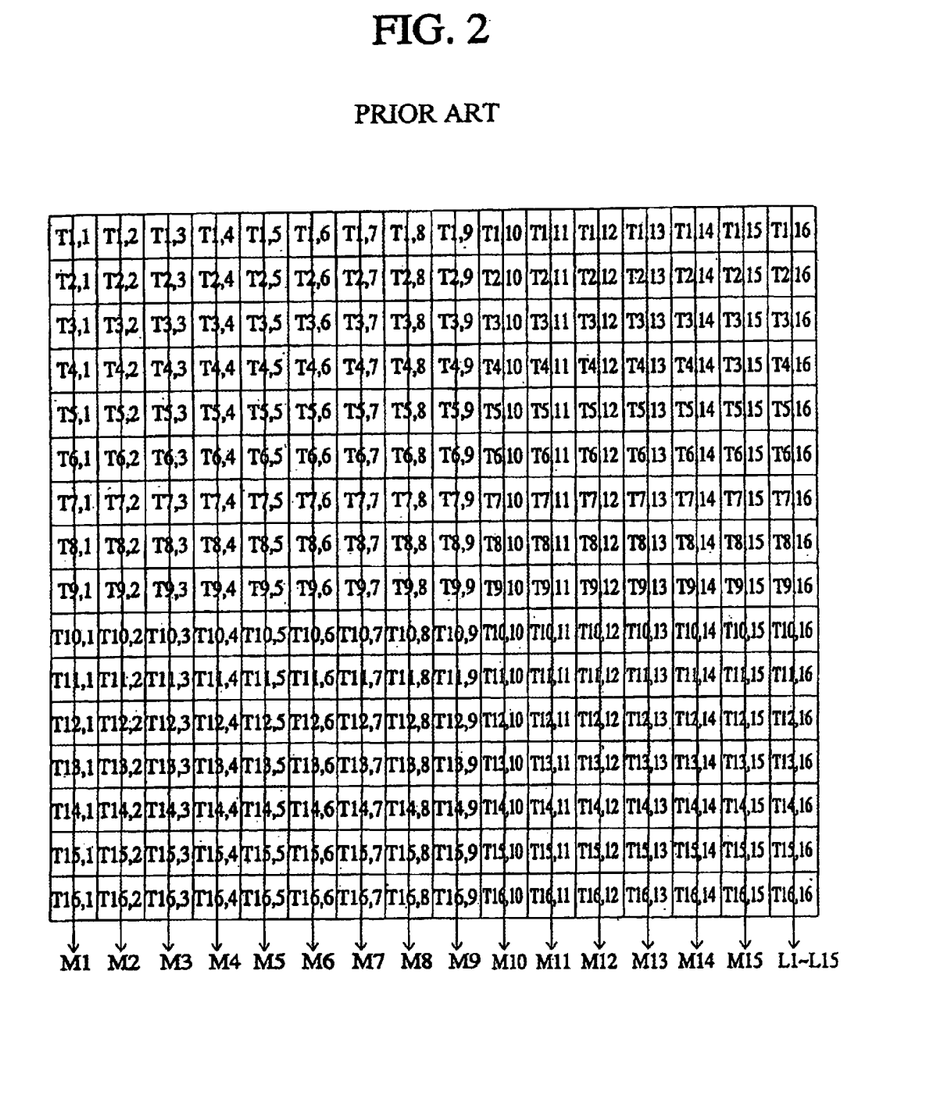
FIG. 2 shows an example of a conventional layout method of a MSB and LSB transistor array of the flash type D/A converting circuit of FIG. 1.

FIG. 2 shows an example of a layout method of the MSB and LSB transistor array of the flash type D/A converting circuit of FIG. 1. In FIG. 2, the transistor array has 16 rows and 16 columns.

In FIG. 2, T1,1 to Tn,n denote an array area. A digit next to "T" denotes a row, and a next digit denotes a column. For example, T1,1 denotes an array area located at a first row and a first column.

A layout method of the transistor array of FIG. 2 is explained below.

The MSB transistor M1 is arranged on each of the areas T1,1, T2,1, . . . , T16,1, which are each the same size as an LSB transistor. The MSB transistor M2 is arranged on each of the areas T2,2, . . . , T16,2 and T1,2, which are each the same size as an LSB transistor. The MSB transistor M15 is arranged on each of the areas T2,15, . . . , T16,15 and T1,15, which are each the same size as an LSB transistor. 16 transistors which constitute each of the MSB transistors M1 to M15 are arranged in the same column, forming a line. The LSB transistors L1 to L15 are, respectively, arranged on the areas T2,16, . . . , T15,16, and T1,16. Thus, the LSB transistors L1 to L15 are arranged in a $16_{th}$ column, forming a line.

The layout method of FIG. 2 has a problem in that transistors of the transistor array do not have the same operational characteristics since the transistors of the transistor array have different temperature distributions and process variations according to their arranged location. That is, the transistors of the transistor array have an error value that varies with a temperature distribution and a process variation. Therefore, signals outputted from the transistor array could not be generated to have a uniform level difference.

Figure 3:
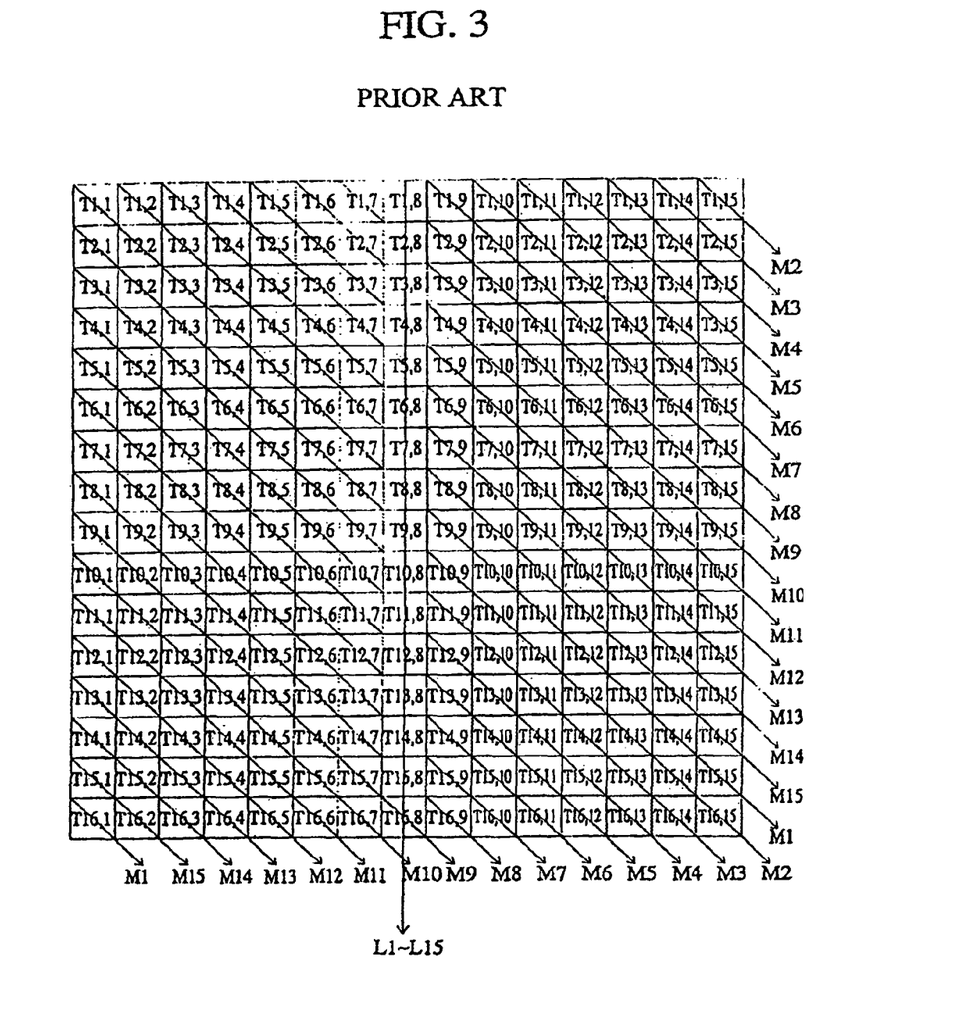
FIG. 3 shows another conventional layout method of a MSB and LSB transistor array of the flash type D/A converting circuit of FIG. 1.

FIG. 3 shows another layout method of the MSB and LSB transistor array of the flash type D/A converting circuit of FIG. 1. As shown in FIG. 3, a single transistor is arranged on each of the array areas T1,1 to T16,15.

The layout method of FIG. 3 is explained below.

The LSB transistors L1 to L15 are arranged on the areas T1,8, T2,8, . . . , T15,8 and T16,8, respectively. That is, the LSB transistors L1 to L15 are arranged in the $8^{th}$ column, forming a line. The MSB transistor M1 is arranged on each of the areas T1,1, . . . T7,7, T9,9, . . . , T15,15, and T16,1, which are each the same size as an LSB transistor. The MSB transistor M2 is arranged on each of the areas T1,15, T2,1, . . . , T8,7, T10,9 . . . , T16,15, which are each the same size as an LSB transistor. The MSB transistor M15 is arranged on each of the areas T1,2, . . . , T6,7, T8,9. T14,15, T15,1, and T16,2, which are each the same size as an LSB transistor. In the same way, the rest of the MSB transistors M3 to M14 are also arranged in a diagonal direction. That is, the MSB transistors M1 to M15 are arranged in the areas along diagonal directions while skipping the $8^{th}$ column.

The layout methods of FIGS. 2 and 3 are described in U.S. Pat. No. 5,568,145.

To solve a problem of the layout method of FIG. 2, the layout method of FIG. 3 arranges each of the MSB transistors M1 to M15, which are turned on simultaneously, in a diagonal direction to reduce the effects of temperature distribution and process variation.

However, since the LSB transistors L1 to L15 are arranged only in a central portion, such arrangement cannot remove the effects of temperature distribution and process variation. Therefore, signals outputted from the transistor array can not be generated with a uniform level difference.

SUMMARY OF THE INVENTION

It is a feature of the present invention to provide a transistor array in which transistors are arranged to minimize the effects of temperature distribution and process variation, thereby generating signals having a uniform level difference therefrom.

It is another feature of the present invention to provide a layout method of a transistor array in which transistors are arranged to minimize the effects of temperature distribution and process variation, thereby generating signals having a uniform level difference therefrom.

In order to realize the above features, preferred embodiments of the present invention provide a transistor array, comprising a plurality of LSB transistors arranged along diagonal directions of a central portion of an array including a plurality of rows and a plurlity of columns; and a plurlity of MSB transistors arranged, respectively, along diagonal directions above and below the plurality of LSB transistors.

The present invention further provides a transistor array, comprising a plurality of first LSB transistors arranged along diagonal directions of a central portion of a first quadrant of an array including a plurality of rows and a plurality of columns; a plurality of first MSB transistors arranged along diagonal directions respectively above and below the plurality of first LSB transistors; a plurality of second LSB transistors and a plurality of second MSB transistors arranged on a second quadrant of the array to be symmetrical in a Y-axis direction to the plurality of first LSB transistor and the plurality of first MSB transistors; a plurality of third LSB transistors and a plurality of third MSB transistors arranged on a third quadrant of the array to be symmetrical in an X-axis direction to the plurality of first LSB transistor and the plurality of first MSB transistors; and a plurality of fourth LSB transistors and a plurality of fourth MSB transistors arranged on a fourth quadrant of the array to be symmetrical in a Y-axis direction to the plurality of third LSB transistors and the plurality of third MSB transistors.

The present invention further provides a layout method of a transistor array, comprising arranging a plurality of LSB transistors along diagonal directions of a central portion of an array including a plurality of rows and a plurlity of columns; and arranging a plurlity of MSB transistors, respectively, along diagonal directions above and below the plurality of LSB transistors.

The present invention further provides a layout method of a transistor array, comprising arranging a plurality of first LSB transistors along diagonal directions of a central portion of a first quadrant of an array including a plurality of rows and a plurality of columns; arranging a plurality of first MSB transistors along diagonal directions, respectively, above and below the plurality of first LSB transistors; arranging a plurality of second LSB transistors and a plurality of second MSB transistors on a second quadrant of the array to be symmetrical in a Y-axis direction to the plurality of first LSB transistors and the plurality of first MSB transistors; arranging a plurality of third LSB transistors and a plurality of third MSB transistors on a third quadrant of the array to be symmetrical in an X-axis direction to the plurality of first LSB transistors and the plurality of first MSB transistors; and arranging a plurality of fourth LSB transistors and a plurality of fourth MSB transistors on a fourth quadrant of the array to be symmetrical in a Y-axis direction to the plurality of third LSB transistors and the plurality of third MSB transistors.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which:

FIG. 5 is a graph showing an error distribution obtained by linearizing and modeling the systematic error distribution of FIG. 4a;

DETAILED DESCRIPTION OF PREFFERED EMBODIMENTS

Reference will now be made in detail to preferred embodiments of the present invention, examples of which are illustrated in the accompanying drawings.

The present invention teaches a layout method of a transistor array using systematic and graded error distributions, which show an error distribution according to a temperature distribution and process variation.

Figure 4A:
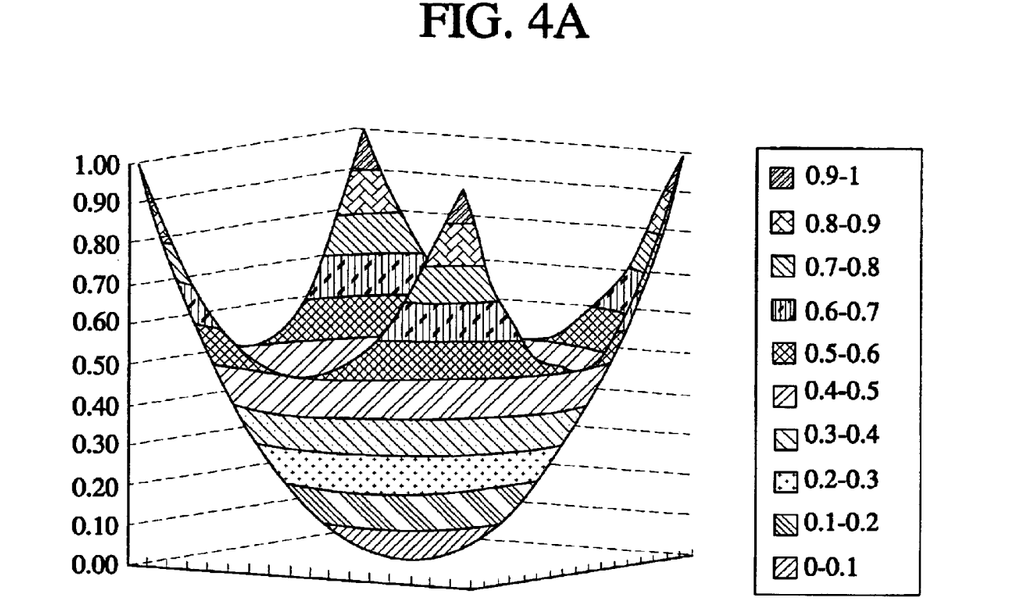
FIGS. 4a and 4b are graphs showing systematic and graded error distributions according to locations of transistors arranged in a single chip, respectively.
Figure 4B:
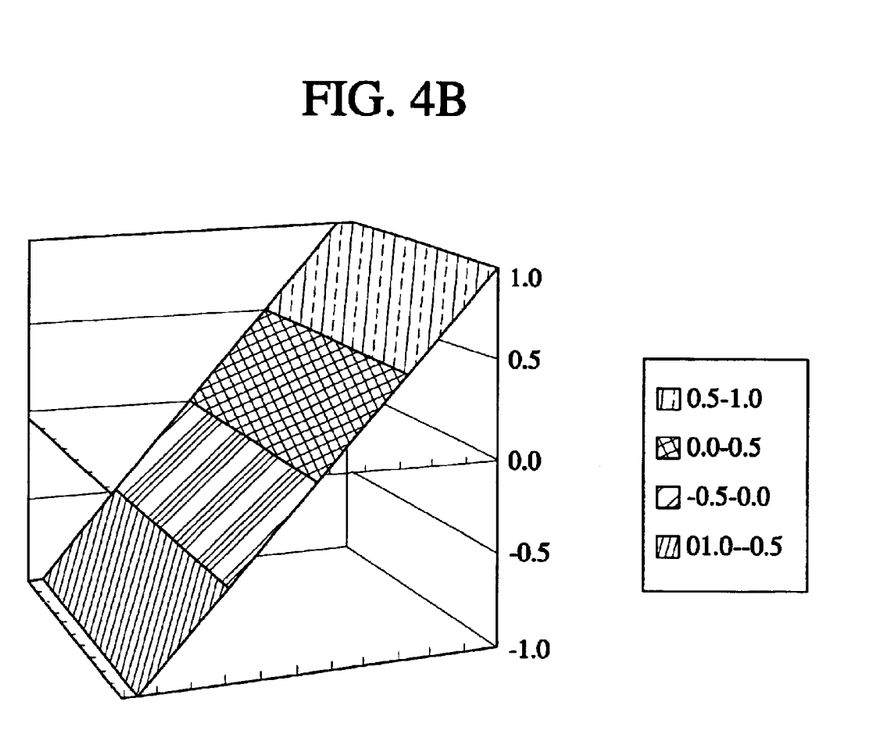

FIGS. 4a and 4b are graphs showing systematic and graded error distributions according to locations of transistors arranged in a single chip, respectively. In FIGS. 4a and 4b, an underside denotes a location of transistors arranged in a single chip, and a vertical axis denotes error values for respective locations of transistors.

As shown in FIG. 4a, transistors arranged on a central portion have error values from 0.1 to 1.0, and have larger error values for transistors more distant from a central portion. The transistors arranged on an edge portion have an error value of 0.9 to 1.0. That is, the error distribution of FIG. 4a shows a spatial distribution.

As shown in FIG. 4b, transistors arranged on a central portion have an error value of 0.0. The transistors have larger error values for transistors more distant from a central portion to a right side, and the transistors have smaller error values for transistors more distant from a central portion to a left side. That is, the error distribution of FIG. 4b shows a plane distribution.

Figure 5:
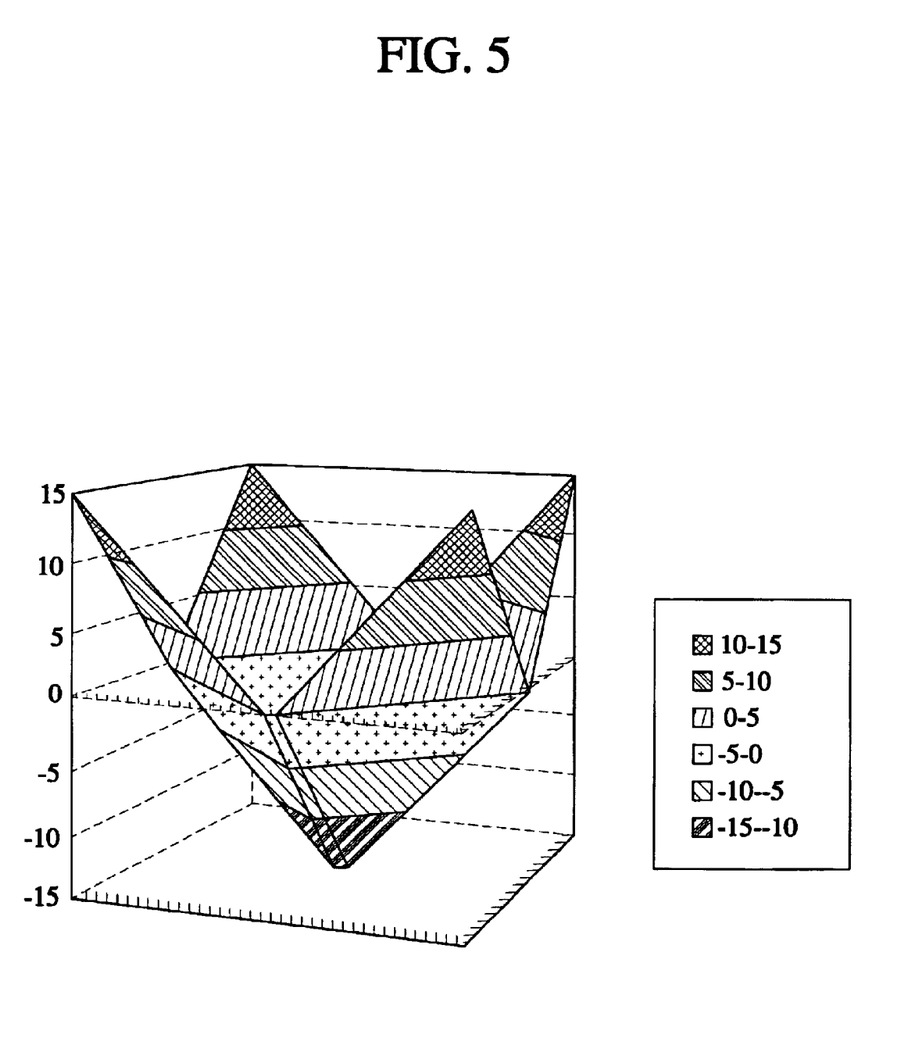

FIG. 5 is a graph showing an error distribution obtained by linearizing and modeling the systematic error distribution of FIG. 4a. In FIG. 5, weighted error values range from −15 to 15 by applying a weighting factor to the error values.

As can be seen in FIG. 5, the error values of the transistors arranged on a central portion of the transistor array ranges from −15 to −10, and the error values become generally larger as the transistors become farther from the central portion. That is, the error values of the transistors arranged on an edge portion range from 10 to 15.

Figure 6:
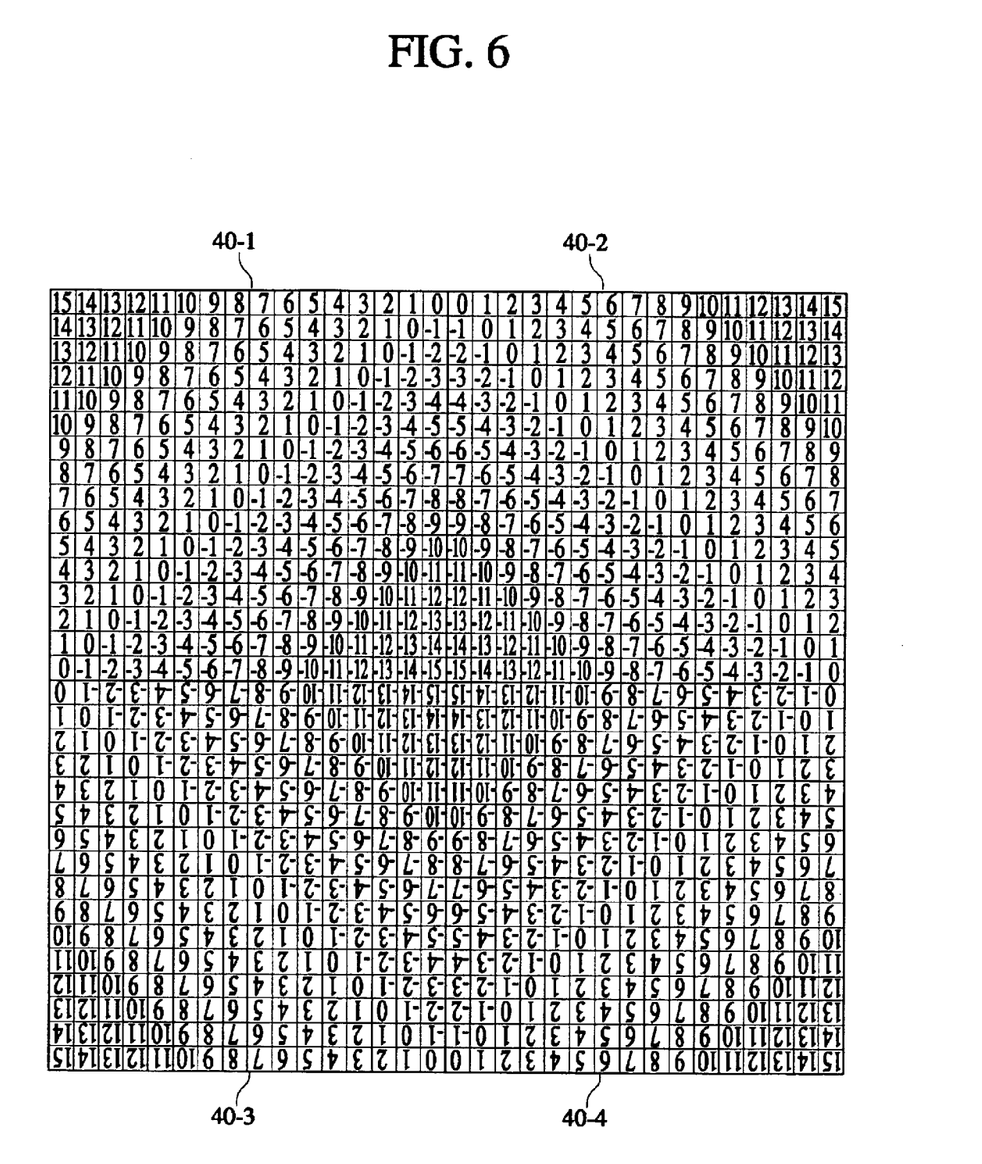
FIG. 6 shows error values according to an arrangement location of the transistors by the error values shown in the graph of FIG. 5.

FIG. 6 shows error values according to an arrangement location of the transistors by the error values shown in the graph of FIG. 5.

As shown in FIG. 6, the chip with the transistor array arranged thereon is divided into 32×32 areas on which the error value is written. Areas of a diagonal direction of a first quadrant 40-1 inclined to a right side, areas of a diagonal direction of a second quadrant 40-2 inclined to a left side, areas of a diagonal direction of a third quadrant 40-3 inclined to a left, and areas of a diagonal direction of a fourth quadrant 40-4 inclined to a right side have an error value of "0". Areas of a nearest inside diagonal direction to the diagonal direction areas having an error value of "0" have an error value of "−1", and areas of a farthest inside diagonal direction have an error value of "−15". That is, the error value is decreased by "1" as it is inwardly displaced from the area having an error value of "0". Areas of a nearest outside diagonal direction to the diagonal direction areas having an error value of "0" have an error value of "1", and areas of a farthest outside diagonal direction have an error value of "15". That is, the error value is increased by "1" as it is outwardly displaced from the area having an error value of "0".

Figure 7:
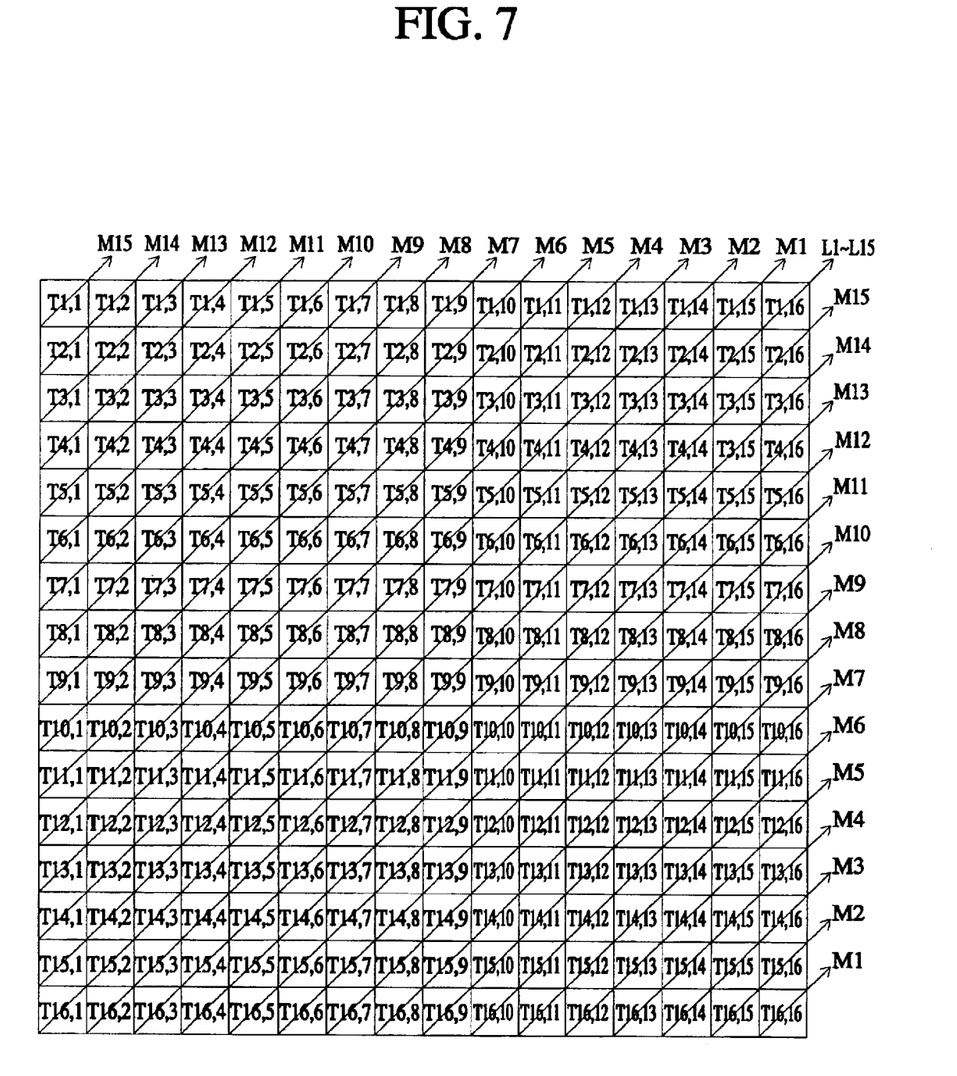
FIG. 7 shows a layout method of a transistor array according to the present invention.

FIG. 7 shows a layout method of a transistor array according to the present invention. The LSB transistors L1 to L15 of FIG. 1 are arranged on areas of a diagonal direction, forming a line, and the MSB transistors M1 to M15 are arranged on upper and lower areas, respectively, centering on the diagonal line formed by the LSB transistors L1 to L15.

In more detail, the LSB transistors L1 to L15 are arranged on the areas T1,16, T2,15, . . . , T16,1, forming a line. The MSB transistors M1 are arranged on each of the areas T1,15, . . . , T15,1, and T16,16 which are each the same size as an LSB transistor. The MSB transistors M2 are arranged on each of the areas T1,14, T2,13, . . . , T14,1, T15,16, and T16,15 which are each the same size as an LSB transistor. The transistors M15 are arranged on each of the areas T2,6, T3,15, . . . , T16,2, and T1,1 which are each the same size as an LSB transistors. The other MSB transistors M3 to M14 are also arranged in a diagonal direction. That is, the MSB transistors M1 to M15 above the LSB transistors are arranged in increasing numerical order from the diagonal direction areas T1,15 to T15,1 close to the LSB transistors L1 to L15 to an edge area T1,1. The MSB transistors M1 to M15 below the LSB transistors are arranged reversely or in decreasing numerical order from the diagonal direction areas T2,16 to T16,2 close to the LSB transistors L1 to L15 to an edge area T16,16.

That is, in the layout method of FIG. 7, the LSB transistors L1 to L15 respectively have an error value of "0", and a sum total of the error values of the transistors of each of the MSB transistors M1 to M15 is all "0".

The layout method of FIG. 7 can reduce the effects of temperature distribution and process variation because the LSB transistors L1 to L15 as well as the MSB transistors M1 to M15 are arranged in a diagonal direction.

However, the layout method of FIG. 7 may not perfectly remove all effects of temperature distribution and process variation because it does not have a completely symmetrical structure.

Figure 8:
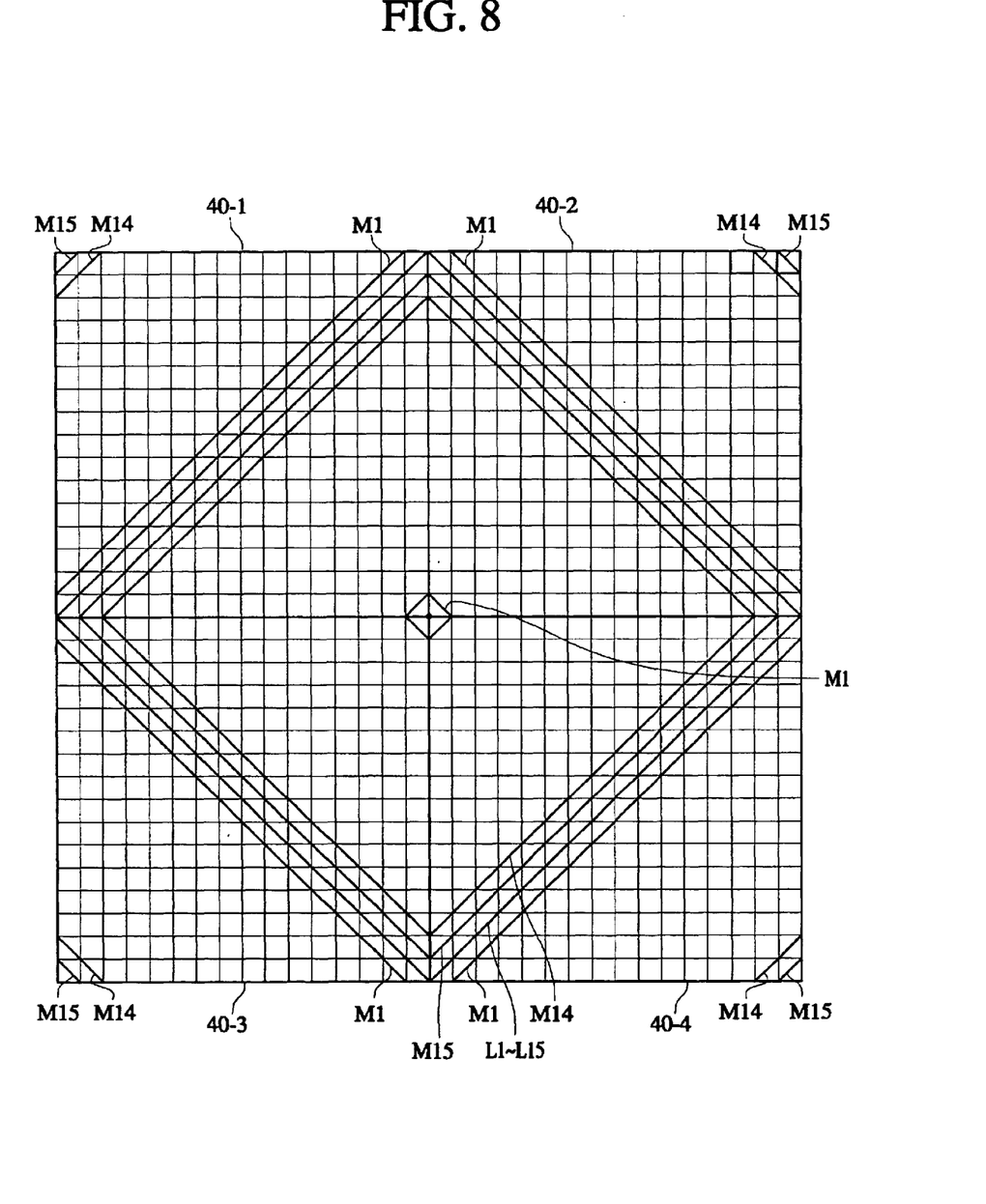
FIG. 8 shows another layout method of the transistor array according to the present invention.

FIG. 8 shows another layout method of a transistor array according to the present invention. Each of the MSB transistors M1 to M15 of FIG. 7 includes 16 LSB-sized transistors, but each of the MSB transistors M1 to M15 of FIG. 8 includes 64 LSB-sized transistors. A size of a transistor arranged on a single grid area shown in FIG. 8 is a quarter of that of a transistor of FIG. 7.

The layout method of FIG. 8 arranges a transistor array in consideration of error values of FIG. 6 such that an error value of each of the LSB transistors L1 to L15 is "0", and a sum total of error values of 64 transistors which constitute each of the MSB transistors M1 to M15 is "0".

That is, the transistor array of a first quadrant 40-1 is arranged in the same way as the layout method of FIG. 7. The transistor array of a second quadrant 40-2 is arranged to be symmetric in a Y-axis direction to the transistor array of the first quadrant 40-1. The transistor array of a third quadrant 40-3 is arranged to be symmetric in an X-axis direction to the transistor array of the first quadrant 40-1. The transistor array of a fourth quadrant 40-4 is arranged to be symmetric in a Y-axis direction to the transistor array of the third quadrant 40-3.

The layout method of FIG. 8 can minimize the effects of temperature distribution and process variation by a completely symmetrical arrangement of the LSB and MSB transistors based on the error values according to locations of the transistors.

Therefore, signals outputted from the transistor array can be generated with a uniform level difference.

As will be recognized by those of ordinary skill in the pertinent art, the present invention is described for exmplary transistor arrays, but can be similarly applied to the layout method of a capacitor array, for example.

As described herein, the transistor array and the layout method of the transistor array according to the present invention can minimize the effects of temperature distribution and process variation. Accordingly, a circuit element like a flash type D/A converting circuit having the transistor array of the present invention can have improved operation characteristics.

While the invention has been particularly shown and described with reference to preferred embodiments thereof, it will be understood by those of ordinary skill in the pertinent art that the foregoing and other changes in form and details may be made therein without departing from the spirit and scope of the invention, as set forth in the appended claims.

What is claimed is:

1. A transistor array, comprising:
  a plurality of LSB transistors arranged along diagonal directions of a central portion of an array including a plurality of rows and a plurality of columns; and
  a plurality of MSB transistors arranged along diagonal directions above and below the plurality of LSB transistors, respectively.

2. The transistor array of claim 1, wherein each of the plurality of MSB transistors includes a plurality of transistors having the same size as an LSB transistor.

3. The transistor array of claim 1, wherein among the plurality of MSB transistors, the MSB transistors above the LSB transistors are arranged in increasing numerical order (e.g., M1, M2, etc.) from the diagonal direction areas close to the plurality of LSB transistors to an edge area, and the MSB transistors below the LSB transistors are arranged reversely or in a decreasing numerical order (e.g., M15, M14, etc.) from the diagonal direction areas close to the plurality of LSB transistors to an edge area.

4. A transistor array, comprising:
a plurality of first LSB transistors arranged along diagonal directions of a central portion of a first quadrant of an array including a plurality of rows and a plurality of columns;
a plurality of first MSB transistors arranged along diagonal directions respectively above and below the plurality of first LSB transistors;
a plurality of second LSB transistors and a plurality of second MSB transistors arranged on a second quadrant of the array to be symmetrical in a Y-axis direction to the plurality of first LSB transistors and the plurality of first MSB transistors;
a plurality of third LSB transistors and a plurality of third MSB transistors arranged on a third quadrant of the array to be symmetrical in an X-axis direction to the plurality of first LSB transistors and the plurality of first MSB transistors; and
a plurality of fourth LSB transistors and a plurality of fourth MSB transistors arranged on a fourth quadrant of the array to be symmetrical in a Y-axis direction to the plurality of third LSB transistors and the plurality of third MSB transistors.

5. The transistor array of claim 4, wherein each of the plurality of first to fourth MSB transistors includes a plurality of transistors having the same size as the LSB transistors.

6. The transistor array of claim 4, wherein among the plurality of first MSB transistors, the first MSB transistors above the plurality of first LSB transistors are arranged in order from the diagonal direction areas close to the plurality of LSB transistors to an edge area, and the first MSB transistors below the LSB transistors are arranged reversely from the diagonal direction areas close to the plurality of LSB transistors to an edge area.

7. A layout method of a transistor array, comprising:
arranging a plurality of LSB transistors along diagonal directions of a central portion of an array including a plurality of rows and a plurlity of columns; and
arranging a plurality of MSB transistors, respectively, along diagonal directions above and below the plurality of LSB transistors.

8. The method of claim 7, wherein each of the plurality of MSB transistors includes a plurality of transistors having the same size as the LSB transistors.

9. The method of claim 7, wherein the step of arranging the plurality of MSB transistor includes:
arranging the MSB transistors above the LSB transistors in order from the diagonal direction areas close to the plurality of LSB transistors to an edge area; and
arranging the MSB transistors below the LSB transistors reversely from the diagonal direction areas close to the plurality of LSB transistors to an edge area.

10. A layout method of a transistor array, comprising:
arranging a plurality of first LSB transistors along diagonal directions of a central portion of a first quadrant of an array including a plurality of rows and a plurality of columns;
arranging a plurality of first MSB transistors along diagonal directions above and below the plurality of first LSB transistors, respectively;
arranging a plurality of second LSB transistors and a plurality of second MSB transistors on a second quadrant of the array to be symmetrical in a Y-axis direction to the plurality of first LSB transistors and the plurality of first MSB transistors;
arranging a plurality of third LSB transistors and a plurality of third MSB transistors on a third quadrant of the array to be symmetrical in an X-axis direction to the plurality of first LSB transistors and the plurality of first MSB transistors; and
arranging a plurality of fourth LSB transistors and a plurality of fourth MSB transistors on a fourth quadrant of the array to be symmetrical in a Y-axis direction to the plurality of third LSB transistors and the plurality of third MSB transistors.

11. The method of claim 10, wherein each of the plurality of first to fourth MSB transistors includes a plurality of transistors having the same size as the LSB transistors.

12. The method of claim 10, wherein the step of arranging the plurality of first MSB transistors includes:
arranging the first MSB transistors above the plurality of first LSB transistors in order from the diagonal direction areas close to the plurality of LSB transistors to an edge area; and
arranging the first MSB transistors below the LSB transistors reversely from the diagonal direction areas close to the plurality of LSB transistors to an edge area.

13. A transistor array comprising:
a plurality of first transistors arranged along a diagonal direction of a central portion of an array; and
a plurality of second or compound transistors, each compound transistor comprising a plurality of component transistors arranged with component transistors of each compound transistor disposed along diagonal directions both above and below the plurality of first transistors, respectively.

14. The transistor array of claim 13 wherein the plurality of second transistors disposed above the plurality of first transistors are arranged in increasing numerical order from the diagonal direction areas close to the plurality of first transistors to an edge area, and the plurality of second transistors below the plurality of first transistors are arranged reversely or in a decreasing numerical order from the diagonal direction areas close to the plurality of first transistors to an edge area.

15. The transistor array of claim 14 wherein said transistor array defines a first quadrant of a larger array, said larger array further comprising second, third and fourth quadrants disposed adjacent to the first quadrant and arranged such that the second quadrant is symmetric in a Y-axis direction to the transistor array of the first quadrant, the third quadrant is symmetric in an X-axis direction to the transistor array of the first quadrant, and the fourth quadrant is symmetric in a Y-axis direction to the transistor array of the third quadrant.

16. The transistor array of claim 15 wherein the larger array comprises a transistor array arranged in consideration of error values such that an error value of each of the plurality of first transistors is about zero, and the sum totals of error values of a plurality of component transistors which constitute each of the second or compound transistors is about zero.

17. The transistor array of claim 16 wherein the error values have normalized weighting with respect to the error values of the plurality of first transistors.

18. The transistor array of claim 14 wherein the numerical order corresponds to the magnitude of significance of a bit position.

19. The transistor array of claim 13 wherein each of the plurality of first transistors comprises a less-significant-bit transistor, and each of the plurality of second transistors comprises a more-significant-bit transistor.

20. The transistor array of claim 13 wherein the array implements a digital-to-analog conversion circuit.

* * * * *